United States Patent [19]

Ohuchi et al.

[11] Patent Number: 5,793,061
[45] Date of Patent: Aug. 11, 1998

[54] GROUP-III NITRIDE BASED LIGHT EMITTER

[75] Inventors: Youichiro Ohuchi; Hiroaki Okagawa, both of Itami; Shinichi Watabe, Maebaru; Kazuyuki Tadatomo, Itami, all of Japan

[73] Assignee: Mitsubishi Cable Industries, Ltd., Japan

[21] Appl. No.: 703,482

[22] Filed: Aug. 28, 1996

[30] Foreign Application Priority Data

Aug. 28, 1995 [JP] Japan .................. 7-243645

[51] Int. Cl.$^6$ .................. H01L 33/00
[52] U.S. Cl. .................. 257/96; 257/103; 257/94
[58] Field of Search .................. 257/96, 183, 767, 257/751, 103, 94

[56] References Cited

U.S. PATENT DOCUMENTS 5,345,463  9/1994  Mannoh et al. .................. 372/45

FOREIGN PATENT DOCUMENTS 0540799  5/1993  European Pat. Off. .................. 257/96
6-283825  10/1994  Japan .

Primary Examiner—Jerome Jackson
Assistant Examiner—Nathan K. Kelly
Attorney, Agent, or Firm—Wenderoth, Lind & Ponack

[57] ABSTRACT

A group-III nitride based light emitter such as LED and LD, which has a double heterostructure and which comprises a diffusion suppressive layer between a p-type cladding layer and an active layer. The diode having a diffusion suppressive layer of the present invention has higher luminous intensity, greater forward voltage, and longer lifetime than the conventional diodes.

5 Claims, 1 Drawing Sheet

GROUP-III NITRIDE BASED LIGHT EMITTER

FIELD OF THE INVENTION

The present invention relates to a group-III nitride based light emitter such as light emitting diodes and laser diodes.

BACKGROUND OF THE INVENTION

Of the light emitting diodes, a group-III nitride based light emitting diode emits short wavelength lights of, for example, from green to ultraviolet light. Some of them have a double hetero structure which basically comprises an n-type cladding layer, an active layer and a p-type cladding layer successively formed on a substrate via a buffer layer.

Such n-type cladding layer, active layer and p-type cladding layer are doped with various dopants for the purpose of controlling the conduction type or for forming a light emitting center, wherein frequently used as said dopants are, for example, Si, Ge and the like for the n-type cladding layer; Zn, Cd, Si and the like for the active layer; and Zn, Mg, Cd, Be and the like for the p-type cladding layer.

As exemplified in FIG. 2, a known group-III nitride based light emitting diode having a double heterostructure comprises an n-type cladding layer 13, an active layer 14 and a p-type cladding layer 16 successively formed on a substrate 11 via a buffer layer 12. Specifically, a sapphire substrate is used for the substrate 11; AlGaN materials are used for the n-type cladding layer 13 and p-type cladding layer 16; InGaN material is used for the active layer 14; Si is used as a dopant for the n-type cladding layer 13; Mg is used as a dopant for the p-type cladding layer 16; and Zn, Si and the like are used as dopants for the active layer 14.

Of various dopants used for such n-type cladding layer, active layer and p-type cladding layer, Mg, Zn and the like which are doped into the active layer and p-type cladding layer easily diffuse into the adjacent semiconductor layers during growth of each layer mentioned above and light emission of the prepared diode. As a result, for example, the dopant which moved from the p-type cladding layer to the active layer due to diffusion decreases the amount of the dopant in the p-type cladding layer. In addition, the dopant diffused into the active layer may form a nonradiative recombination center. Consequently, the luminous intensity of the light emitting diode decreases to ultimately shorten the lifetime of the diode. For example, the use of the diode for 5,000 hours may reduce the luminous intensity to less than 50% of the initial luminous intensity.

The diffusion is generally promoted with increasing temperatures, and the temperature during growth of semiconductor layers varies depending on the melting point of the materials used for each layer. Each layer of group-III nitride based light emitting diode composed of GaN, AlGaN materials, InGaN materials and the like needs to be grown at higher temperatures, thus promoting the diffusion of dopants. In addition, emission of the light accompanies generation of heat which inevitably causes diffusion, though gradual, of dopants.

It is therefore an object of the present invention to suppress diffusion of dopants in a light emitter based on group-III nitride such as gallium nitride, whereby to prevent degradation of the property thereof.

SUMMARY OF THE INVENTION

The inventive group-III nitride based light emitter such as light emitting diodes and laser diodes has a double heterostructure wherein a diffusion suppressive layer is formed between a p-type cladding layer and an active layer.

Such diffusion suppressive layer aims at suppression of a mutual diffusion of dopants which occurs between the p-type cladding layer and active layer and which degrades properties of the emitter. More particularly, the diffusion suppressive layer aims at suppression of diffusion of the dopant of the p-type cladding layer into the active layer.

DESCRIPTION OF THE PREFERRED EMBODIMENTS

Figure 1:
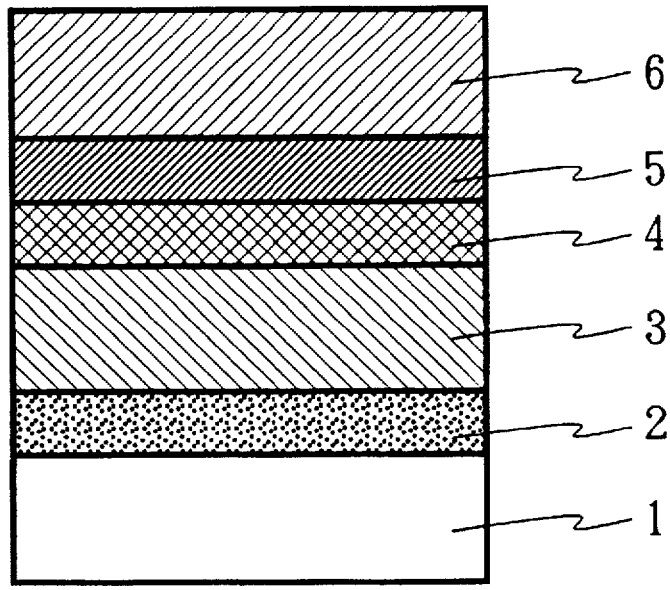
FIG. 1 shows a cross section of one embodiment of the inventive group-III nitride based light emitting diode.
Figure 2:
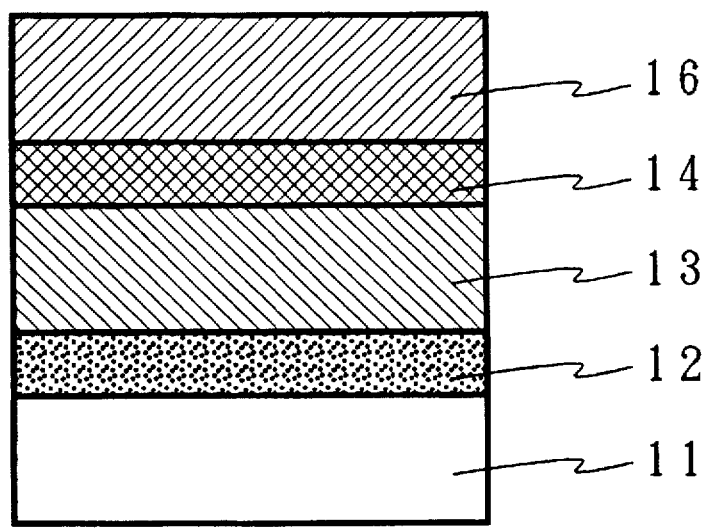
FIG. 2 shows a cross section of a conventional gallium nitride based light emitting diode.

The diode of the embodiment shown in FIG. 1 has a double heterostructure wherein a buffer layer 2 is formed on a substrate 1, and an n-type cladding layer 3, an active layer 4, a diffusion suppressive layer 5, and a p-type cladding layer 6 are successively formed thereon.

The materials for the n-type cladding layer 3 and p-type cladding layer 6 are determined according to the material used for the active layer 4, and are exemplified by GaN, AlGaN materials such as $Al_{0.1}Ga_{0.9}N$, InGaN materials such as $In_{0.1}Ga_{0.9}N$, and InGaAlN materials. The thickness of each layer is 2–6 μm for n-type cladding layer 3 and about 0.3–1.5 μm for p-type cladding layer 6. While the material of the active layer 4 vary depending on the wavelength region of the light emitted from the diode to be prepared, InGaN materials such as $In_{0.1}Ga_{0.9}N$, $In_{0.2}Ga_{0.8}N$ and $In_{0.4}Ga_{0.6}N$, GaN and the like can be used, and the thickness is about 0.001–0.1 μm. The dopants for n-type cladding layer 3 are preferably elements of Si, Ge, Sn and the like in view of n-type conduction. Si is particularly preferable, since it affords high doping efficiency and fine surface of the doped layer. Doping is performed so that the carrier concentration becomes $1 \times 10^{17} - 1 \times 10^{19}$ cm$^{-3}$. Similarly, the elements of Zn, Mg, Cd, Be and the like are preferable for p-type cladding layer 6 in view of p-type conduction. Among them, Mg is particularly preferable, since it shows smaller acceptor level and is easily activated. In this case, the doping is performed so that the carrier concentration becomes $3 \times 10^{17} - 8 \times 10^{18}$ cm$^{-3}$. Various dopants are used for the active layer 4 depending on the wavelength of the light emitted from the diode. Si is preferably used for emitting ultraviolet light, and Zn, Cd, Si and the like are preferably used for emitting blue to blue green light. Of the dopants used for emitting blue to blue green light, Zn and Si are particularly preferable in terms of handling of the precursor thereof.

Of the various dopants to be doped into the above-mentioned n-type cladding layer 3, p-type cladding layer 6 and active layer 4, however, Zn and Mg are easily diffused into the adjacent layers. Thus, a diffusion suppressive layer 5 is formed between the p-type cladding layer 6 into which Mg and the like are doped, and the active layer 4, in the group-III nitride based light emitting diode of the present invention having a double heterostructure, to suppress or prevent diffusion of such easily-movable dopants. Such easily-movable dopants may move due to diffusion or migration. The diffusion suppressive layer of the present invention suppresses or prevents move of the dopants due to diffusion and/or migration. Accordingly, diffusion of dopants in the present invention also includes move due to migration.

The diffusion suppressive layer 5 suffices for use as long as it can suppresses at least most of the diffusion of the dopants between the p-type cladding layer 6 and the active layer 4. It is more preferable that it substantially and certainly suppress or prevent the diffusion. For the improvement of the suppressive or preventive performance of the diffusion suppressive layer 5, the thickness of the diffusion suppressive layer 5 is generally increased, in which case, the forward voltage required for light emission needs to be increased, thus causing problems such as low light emission efficiency. On the other hand, when the thickness of the diffusion suppressive layer 5 is insufficient, the suppressive effect thereof becomes poor. Thus, the thickness of the diffusion suppressive layer 5 is 0.001–2 µm, particularly 0.005–0.5 µm, and more particularly 0.01–0.2 µm.

Smaller concentrations of the impurities in the diffusion suppressive layer 5 are preferable in that the diffusion of the dopants between the above-mentioned layers can be absorbed in the diffusion suppressive layer 5, while the degree of diffusion of impurities in the diffusion suppressive layer 5 can be decreased to more effectively suppress the diffusion. For this end, the diffusion suppressive layer 5 is particularly preferably an undoped layer.

When the group-III nitride based light emitting diode is prepared by epitaxial growth, the material of the diffusion suppressive layer 5 is subject to no particular limitation as long as it can lattice match with either the p-type cladding layer 6 or the active layer 4, with preference given to $In_xGa_yAl_{1-x-y}N$ wherein $0 \leq x \leq 1$, $0 \leq y \leq 1$, and $x+y \leq 1$, from the aspect of the aforementioned lattice match, since the materials of the both layers sandwiching the diffusion suppressive layer 5 are mainly GaN, AlGaN materials, InGaN materials and InGaAlN materials. Specifically, GaN, InN, AlN, InGaN, AlGaN, InAlN and InGaAlN are exemplified as the material of the diffusion suppressive layer 5.

The diffusion suppressive layer 5 may be a single layer composed of a single material or of a multi-layer structure. The interface between layers in the multi-layer structure tends to trap the dopants which have entered the diffusion suppressive layer 5, whereby the suppressive effect on the diffusion of the dopant of the diffusion suppressive layer 5 can be advantageously improved. Such multi-layer structure can be formed by alternatively laminating at least two kinds of materials as mentioned above. For example, a first layer is prepared from GaN and a second layer is formed from AlGaN. This pair of layers is laminated by alternatively forming each layer to give a desired multi-layer structure.

While any number of layers and materials can be used for forming the multi-layer structure, the total number of the layers is preferably 2–50, more preferably 2–10, and the number of materials is 2–4, preferably 2, from the reasons of easiness of manufacture.

Be it a single layer or of a multi-layer structure, the materials of the upper and lower layers which come into contact with the p-type cladding layer or active layer preferably have superior lattice matching property to facilitate manufacture. When the diffusion suppressive layer 5 is a single layer, this layer and the p-type cladding layer are formed from the same semiconductor material and only the p-type cladding layer is subjected to necessary doping, whereby the both layers are extremely easily formed.

In the embodiment of FIG. 1, the n-type cladding layer formed right above the buffer layer 2 may be exchanged with the p-type cladding layer, in which case a buffer layer, a p-type cladding layer, a diffusion suppressive layer, an active layer and an n-type cladding layer are successively formed on the substrate layer.

The present invention is described in more detail in the following by illustrative examples.

Example 1

An LED having the structure shown in FIG. 1 was manufactured. A sapphire (0001) substrate was used as the substrate 1, an AlN layer was formed as the buffer layer 2, an Si-doped GaN layer was formed as the n-type cladding layer 3, a Zn-doped InGaN layer was formed as the active layer 4, an undoped GaN layer was formed as the diffusion suppressive layer 5 and an Mg-doped GaN layer was formed as the p-type cladding layer 6.

The LED was prepared by the following method. First, the substrate 1 was placed in a growth chamber wherein the substrate temperature was set to 1050° C. in a hydrogen atmosphere and the substrate was subjected to heat treatment for 10 min. Then, the substrate temperature was lowered to 500° C., and the AlN buffer layer 2 (0.03 µm) was formed by supplying trimethylaluminum (TMA) at a flow rate of 30 cc/min and $NH_3$ at a flow rate of 4 l/min into the growth chamber. The substrate temperature was raised to 1020° C., and the Si-doped GaN n-type cladding layer 3 (ca. 3 µm) was formed by supplying trimethylgallium (TMG) at a flow rate of 50 cc/min, $NH_3$ at a flow rate of 4 l/min, and $SiH_4$ at a flow rate of 30 cc/min into the growth chamber. Then, the substrate temperature was lowered to 700° C., and the Zn-doped $In_{0.2}Ga_{0.8}N$ active layer 4 (ca. 0.01 µm) was formed by supplying trimethylindium (TMI) at a flow rate of 200 cc/min, TMG at a flow rate of 40 cc/min, $NH_3$ at a flow rate of 4 l/min and dimethylzinc (DMZ) at a flow rate of 10 cc/min into the growth chamber. The substrate temperature was raised to 1020° C., and the undoped GaN diffusion suppressive layer 5 (ca. 0.03 µm) was formed by supplying TMG at a flow rate of 50 cc/min and $NH_3$ at a flow rate of 4 l/min into the growth chamber. Finally, the Mg-doped GaN p-type cladding layer 6 (ca. 0.8 µm) was formed by supplying TMG at a flow rate of 50 cc/min, $NH_3$ at a flow rate of 4 l/min and biscyclopentadienylmagnesium ($Cp_2Mg$) at a flow rate of 20 cc/min into the growth chamber at a substrate temperature of 1020° C. In this way, a group-III nitride based light emitting diode was prepared. Then, a heat treatment was applied at 700° C. for 15 min in a nitrogen atmosphere to activate Mg. The carrier concentration of the n-type cladding layer 3 and p-type cladding layer 6 was $1 \times 10^{18}$ $cm^{-3}$ and $7 \times 10^{17}$ $cm^{-3}$, respectively.

Example 2

A diode was prepared in the same manner as in Example 1 using the same materials, method and conditions, except that the thickness of the diffusion suppressive layer 5 was set for 0.1 µm.

Example 3

A diode was prepared in the same manner as in Example 1, except that the thickness of the diffusion suppressive layer 5 was set for 0.5 µm.

Example 4

A diode was prepared in the same manner as in Example 1, except that a 0.03 µm thick undoped $In_{0.2}Ga_{0.8}N$ diffusion suppressive layer 5 was grown at a substrate temperature of 700° C., TMI flow rate of 200 cc/min, TMG flow rate of 40 cc/min and $NH_3$ flow rate of 4 l/min.

Example 5

A diode was prepared in the same manner as in Example 1, except that a 0.005 µm thick GaN was grown at a substrate temperature of 1050° C., TMG flow rate of 50 cc/min and NH$_3$ flow rate of 4 l/min, and a 0.005 μm thick Al$_{0.05}$Ga$_{0.95}$N was grown at TMG flow rate of 50 cc/min, TMA flow rate of 10 cc/min and NH$_3$ flow rate of 4 l/min, whereby to give a layer of GaN/Al$_{0.05}$Ga$_{0.95}$N, followed by two repeats thereof to give a 0.03 μm thick diffusion suppressive layer 5 composed of three layers of GaN/Al$_{0.05}$Ga$_{0.95}$N as a single layer.

Comparative Example

A diode was prepared in the same manner as in Example 1, except that a diffusion suppressive layer 5 was not formed.

With respect to the diodes of Examples 1-5 and Comparative Example, luminous intensity, forward voltage and lifetime of light emission were determined, and the results are shown in Table 1. The forward voltage was that at the forward current of 20 mA, and lifetime of light emission was the time lapsed until the luminous intensity became 50% of the initial value when the forward current set for 50 mA.

TABLE 1

| | Ex. 1 | Ex. 2 | Ex. 3 | Ex. 4 | Ex. 5 | Com. Ex. |
|---|---|---|---|---|---|---|
| n-type cladding layer | Si—GaN (carrier concentration 1 × 10$^{18}$ cm$^{-3}$) | | | | | |
| active layer | Zn—In$_{0.2}$Ga$_{0.8}$N | | | | | |
| p-type cladding layer | Mg—GaN (carrier concentration 7 × 10$^{17}$ cm$^{-3}$) | | | | | |
| material of diffusion suppressive layer | GaN | GaN | GaN | InGaN | GaN/AlGaN | — |
| thickness (μm) of diffusion suppressive layer | 0.03 | 0.1 | 0.5 | 0.03 | 0.03 | — |
| luminous intensity (mcd) | 1070 | 900 | 850 | 1000 | 1000 | 700 |
| forward voltage (V) | 4.0 | 4.5 | 5.5 | 4.0 | 4.0 | 4.0 |
| lifetime (h) | ≧10000 | ≧10000 | ≧10000 | ≧10000 | ≧10000 | 5000 |

As shown in Table 1, the luminous intensity of the diodes of Examples 1-5 were about 1.2-1.5 times higher than that of the diode of Comparative Example, and the forward voltage was greater in Example 3 than in Comparative Example, and the diode of Example 2 showed slightly greater voltage. The lifetime of the diode was more than twice longer in Examples 1-5 than in Comparative Example.

The diodes of the Examples with a diffusion suppressive layer showed about 1.2-1.5 times higher luminous intensity of light emission than without the diffusion suppressive layer, and the lifetime was not less than 10,000 hours which was more than twice longer than the conventional diodes. It was also confirmed that thicker diffusion suppressive layer had higher forward voltages.

What is claimed is:

1. A group-III nitride based light emitter having a double heterostructure, which comprises a diffusion suppressive layer between a p-type cladding layer and active layer, and said diffusion suppressive layer having a multi-layer structure which is formed by alternatively laminating at least two kinds of materials represented by the formula of In$_x$Ga$_y$Al$_{1-x-y}$N wherein 0≦x≦1, 0≦y≦1, and x+y≦1.

2. The light emitter of claim 1, wherein a dopant of the p-type cladding layer is magnesium.

3. The light emitter of claim 1, wherein the diffusion suppressive layer is composed of the same semiconductor material with the p-type cladding layer.

4. The light emitter of claim 1, wherein the diffusion suppressive layer has a thickness of 0.01-0.2 μm.

5. The light emitter of any one of claims 2, 3 or 1, wherein the diffusion suppressive layer is an undoped layer.

* * * * *